US012672380B2

(12) United States Patent
Eisele et al.

(10) Patent No.: US 12,672,380 B2
(45) Date of Patent: Jun. 30, 2026

(54) PHOTODIODE WITH ORTHOGONAL LAYER STRUCTURE

(71) Applicant: Fraunhofer-Gesellschaft zur Förderung der angewandten Forschung e.V., Munich (DE)

(72) Inventors: Ignaz Eisele, Munich (DE); Martin Heigl, Munich (DE); Karl Neumeier, Munich (DE); Lars Nebrich, Munich (DE); Leonhard Sturm-Rogon, Munich (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 339 days.

(21) Appl. No.: 18/360,934

(22) Filed: Jul. 28, 2023

(65) Prior Publication Data

US 2023/0369529 A1      Nov. 16, 2023

Related U.S. Application Data

(63) Continuation of application No. PCT/EP2022/051728, filed on Jan. 26, 2022.

(30) Foreign Application Priority Data

Jan. 29, 2021    (DE) .......................... 102021200828.3

(51) Int. Cl.
*H10F 30/225*      (2025.01)
*H10F 71/00*      (2025.01)
(52) U.S. Cl.
CPC ......... *H10F 71/121* (2025.01); *H10F 30/225* (2025.01)

(58) Field of Classification Search
CPC ............................. H10F 71/121; H10F 30/225
See application file for complete search history.

(56) References Cited

U.S. PATENT DOCUMENTS

| | | |
|---|---|---|
| 10,312,391 B2 | 6/2019 | Chen et al. |
| 2001/0023960 A1 | 9/2001 | Soga et al. |

(Continued)

FOREIGN PATENT DOCUMENTS

| | | |
|---|---|---|
| CN | 110212044 A | 9/2019 |
| DE | 112016004224 T5 | 6/2018 |

(Continued)

OTHER PUBLICATIONS

S. M. Sze et al., "Semiconductor Devices", Physics and Technology, 3. Edition Ed., John Wiley & Sons, 2012.

(Continued)

*Primary Examiner* — Suberr L Chi
(74) *Attorney, Agent, or Firm* — Bridgeway IP Law Group, PLLC; Jihun Kim

(57) ABSTRACT

Embodiments provide a photodiode having two electrodes and an absorption volume for absorbing photons, wherein the absorption volume has a photon entry area, wherein the two electrodes are configured to generate an electric field in an active region between the two electrodes when a reverse voltage is applied, wherein the electric field runs parallel to the photon entry area, wherein, starting from a surface of a semiconductor substrate of the photodiode, the two electrodes essentially extend orthogonally to the surface in a depth direction of the semiconductor substrate, wherein the photodiode has at least one guard structure formed in the semiconductor substrate that is disposed below at least one of the at least two electrodes.

8 Claims, 13 Drawing Sheets

(56) References Cited

U.S. PATENT DOCUMENTS

| | | | |
|---|---|---|---|
| 2006/0186501 A1* | 8/2006 | Ishimura | H10F 30/222 |
| | | | 257/436 |
| 2010/0084690 A1 | 4/2010 | Adkisson et al. | |
| 2010/0282948 A1 | 11/2010 | Miyajima et al. | |
| 2011/0018085 A1 | 1/2011 | An et al. | |
| 2014/0312449 A1 | 10/2014 | Jonak-Auer et al. | |
| 2017/0365636 A1 | 12/2017 | Mazzillo et al. | |
| 2018/0182789 A1 | 6/2018 | Inoue et al. | |
| 2019/0198701 A1 | 6/2019 | Moussy | |

FOREIGN PATENT DOCUMENTS

| | | | |
|---|---|---|---|
| EP | 2747154 A1 | 6/2014 |
| EP | 2779255 A1 | 9/2014 |
| WO | 2014140000 A2 | 9/2014 |
| WO | 2015187222 A2 | 12/2015 |

OTHER PUBLICATIONS

S. M. Sze et al., "Physics of Semiconductor Devices", John Wiley & Sons, 2007, pp. 102-114, 691.
Masahiko Satake, "Office Action for JP Application No. 2023-546017", Oct. 2, 2024, JPO, Japan.

* cited by examiner

100

100

100

101

100

105     103     103

101

100

102    104

156    162    164    bond pad via    160

154

152

105    103_2    150 p dopant
outdiffusion

126

124 conductive
trench filling e.g. p$^+$ polysilicon
or tungsten    101 p$^+$Si

120

130

PHOTODIODE WITH ORTHOGONAL LAYER STRUCTURE

CROSS-REFERENCE TO RELATED APPLICATIONS

This application is a continuation of copending International Application No. PCT/EP2022/051728, filed Jan. 26, 2022, which is incorporated herein by reference in its entirety, and additionally claims priority from German Application No. 102021200828.3, filed Jan. 29, 2021, which is also incorporated herein by reference in its entirety.

TECHNICAL FIELD

Embodiments of the present invention relate to a photodiode and in particular to a photodiode having an orthogonal layer structure with respect to a photon entry area. Further embodiments relate to a method for producing a photodiode. Some embodiments relate to an orthogonal arrangement for avalanche photodiodes (APD) in silicon photomultipliers (SiPM) with high red sensitivity.

BACKGROUND OF THE INVENTION

For detection systems, such as LIDAR (Light Detection and Ranging), highly sensitive photo detectors with high spectral sensitivity in the near infrared range (NIR) are needed. However, in the near infrared range, the absorption coefficient of photons for silicon significantly decreases, such that a large volume is needed for a suitable number of generated electron-hole pairs. To obtain a high electric amplification factor, diodes are operated in the breakdown range of the reverse direction, which results in an avalanche effect. The problem of conventional detectors is that for a vertical structure with increasing absorption volume, the electric voltages needed for the avalanche effect also have to increase, as will be discussed below.

Conventionally, planar avalanche photodiodes (APD) or silicon photomultipliers (SiPM) generated on a silicon substrates have a vertical layer structure. The structure of a vertical avalanche photodiode is exemplarily illustrated in FIG. 1.

In detail, FIG. 1a shows a schematic view of a basic structure of an avalanche photodiode (APD) in cross-section, here with vertical dopant profile course n$^+$–p–i–p$^+$ [1]. The bottom p+ region serves for improved electric transition to the metal rear contact. The n-doped regions at the upper contact edge serve as guard structures against interfering influences from the surrounding intrinsic region.

FIG. 1b shows in diagrams courses of dopant, absorption, electric field and conductor band plotted on the vertical section through the active region in the center of the avalanche photodiode (APD) shown in FIG. 1a.

The diodes are operated in the breakdown region of the reverse direction. When absorbing photons in the active region, electron-hole pairs are generated resulting in an avalanche effect during operation allowing a strong/high/large amplification of the signal.

In common planar photodiodes, electric field and direction of light run parallel. With decreasing absorption ability, this is equal to a decrease of the sensitivity in the long-wave range. This sensitivity loss can be compensated by a long absorption path (=large space-charge zone (SCR)).

For generating a deep space-charge zone, high operating voltage and low-doped silicon material are needed. If amplifying photo receivers, such as avalanche photodiodes or silicon photomultipliers are used, which are operated at very high internal field strengths, so-called guard structures are needed that prevent an undesired lateral breakdown.

With increasing voltage (=deep SCR=increasing red sensitivity), these guard structures become larger and larger.

These guard structures occupy regions of the photon entry area that are not available for detecting photons. Therefore, during operation with higher voltages, the area efficiency of the diode decreases (efficiency of the diode across the overall area).

In [3], a lateral avalanche photodiode formed in an SOI layer is described, where the doping for the multiplication layer is generated by surface implantation and a subsequent diffusion, wherein the same takes place across the entire depth of the SOI layer. Here, the concentration of dopants is greater at the surface than at the bottom of the SOI layer. This causes a depth-dependent change in the breakdown voltage, which is why functioning avalanche photodiodes can only be generated up to a depth of several μm. Only after this diffusion, trench etching is performed to realize the cathode electrode.

Thus, it is the object of the present invention to provide a photodiode with high sensitivity in the long-wave range comprising improved area efficiency.

SUMMARY

According to an embodiment, a method for producing a photodiode may have the steps of: providing a semiconductor substrate, providing at least two electrodes in or on the semiconductor substrate, wherein, starting from a surface of a semiconductor substrate of the photodiode, the two electrodes essentially extend orthogonally to the surface in the depth direction of the semiconductor substrate, providing a diode layer stack between the at least two electrodes, wherein layers of the diode layer stack essentially run orthogonally to a surface of the semiconductor substrate, forming, in the semiconductor substrate, at least one guard structure below at least one of the at least two electrodes, wherein the at least two electrodes, the guard structure and the diode layer stack are provided in the semiconductor substrate by forming, starting from the surface of the semiconductor substrate, at least two spaced-apart recesses in the semiconductor substrate, forming a guard structure recess below one of the at least two electrodes, doping the semiconductor substrate between the at least two recesses, starting from the at least two recesses and partially starting from the guard structure recess, to obtain the guard structure and the diode layer stack between the at least two recesses, wherein layers of the diode layer stack essentially run orthogonally to the surface of the semiconductor substrate, providing the at least two electrodes in the at least two recesses.

Embodiments provide a photodiode having two electrodes [e.g. an anode and a cathode] in an absorption volume for absorbing photons, wherein the absorption volume comprises a photon entry area, wherein the two electrodes are configured to generate, when a reverse voltage is applied, an electric field in an active region [e.g. the absorption volume] between the two electrodes, wherein the electric field runs parallel to the photon entry area [e.g. wherein field lines of the electric field run parallel to the photon entry area].

In embodiments, starting from a surface of a semiconductor substrate of the photodiode, the two electrodes can essentially extend orthogonally to the surface in the depth direction of the semiconductor substrate, wherein the photodiode comprises at least one guard structure formed in the semiconductor substrate that is disposed below at least one of the at least two electrodes.

In embodiments, the at least one guard structure can be enclosed by the semiconductor substrate in the lateral direction and in the depth direction.

In embodiments, a lateral extension of the at least one guard structure can be two to five times a lateral extension of the corresponding electrode.

In embodiments, the at least one guard structure can be spherical, cube-shaped or cuboid-shaped, each with strongly rounded corners or edges.

In embodiments, the semiconductor substrate is a continuous silicon semiconductor substrate.

In embodiments, the two electrodes can essentially run orthogonally [e.g. at an angle of 90° or at an angle of 70° to 110° ] to the photon entry area.

In embodiments, starting from the surface of the semiconductor substrate, the two electrodes can extend into the semiconductor substrate in the depth direction at least to a depth of 5 µm or more [e.g., 10 µm to 30 µm].

In embodiments, starting from a surface of a semiconductor substrate (101) of the photodiode, the two electrodes can extend essentially orthogonally [e.g. at an angle of 90° or at an angle of 70° to 110° ] to the surface in depth direction of the semiconductor substrate 101 [e.g. where the surface runs parallel to the photon entry area].

In embodiments, the absorption volume can be arranged between the two electrodes.

In embodiments, layers [e.g. semiconductor layers] of a diode layer stack between the two electrodes can essentially run orthogonally [e.g. at an angle of 90° or at an angle of 70° to 110° ] to the photon entry area.

In embodiments, the diode layer stack can comprise the following layers:
a $p^+$-doped layer,
an intrinsic or a $p^-$-doped layer,
a p-doped layer and
an $n^+$-doped layer.

In embodiments, the diode layer stack can comprise the following layers:
an $n^+$-doped layer,
an intrinsic or an $n^-$-doped layer,
an n-doped layer and
a $p^+$-doped layer.

In embodiments, the diode layer stack can alternatively also comprise the following layers:
an $n^+$-doped layer,
an intrinsic layer,
a p-doped layer,
an intrinsic layer,
a $p^+$-doped layer.

In embodiments, the diode layer stack can alternatively also comprise the following layers:
a $p^+$-doped layer,
an intrinsic layer,
an n-doped layer,
an intrinsic layer,
an $n^+$-doped layer.

In embodiments, the photodiode can comprise at least one guard structure arranged [e.g. in depth direction of the semiconductor substrate of the photodiode] [e.g. immediately] below at least one of the at least two electrodes [e.g. to concentrate the electric field in the area of the absorption volume [e.g. and to reduce the same in edge areas]].

In embodiments, the photodiode can be an avalanche photodiode or a photoelectron multiplier.

Further embodiments provide a method for producing a photodiode. The method includes a step of providing a semiconductor substrate. Further, the method includes a step of providing at least two electrodes [e.g. anode and cathode] in or on the semiconductor substrate. Further, the method includes a step of providing a diode layer stack between the at least two electrodes, wherein layers of the diode layers stack essentially run orthogonally [e.g. at an angle of 90° or at an angle of 70° to 110° ] to a surface of the semiconductor substrate.

In embodiments, the at least two electrodes and the diode layer stack can be provided in the semiconductor substrate by forming, starting from the surface of the semiconductor substrate, at least two spaced-apart recesses [e.g. trenches] in the semiconductor substrate [e.g. in depth direction of the semiconductor substrate, i.e. orthogonally to the surface of the semiconductor substrate]; doping the semiconductor substrate between the at least two recesses to obtain the diode layer stack [e.g. diode layer structure] between the at least two recesses, wherein layers of the diode layer stack essentially run orthogonally [e.g. at an angle of 90° or at an angle of 70° to 110° ] to the surface of the semiconductor substrate; and providing the at least two electrodes [e.g. anode and cathode] in the at least two recesses.

In embodiments, starting from a surface of a semiconductor substrate of the photodiode, the two electrodes can essentially extend orthogonally to the surface in a depth direction of the semiconductor substrate, the method further comprising forming at least one guard structure below at least one of the at least two electrodes in the semiconductor substrate.

In embodiments, the at least two electrodes, the guard structure, and the diode layer stack can be provided in the semiconductor substrate by forming, starting from the surface of the semiconductor substrate, at least two spaced-apart recesses in the semiconductor substrate; forming a guard structure recess below one of the at least two electrodes; doping the semiconductor substrate between the at least two recesses starting from the at least two recesses and partially starting from the guard structure recess to obtain the guard structure and the diode layer stack between the at least two recesses, wherein layers of the diode layer stack essentially run orthogonally to the surface of the semiconductor substrate; providing the at least two electrodes in the at least two recesses.

In embodiments, the at least two recesses can be formed by etching or by local oxidation of the semiconductor substrate and subsequent removal of the oxide or by growing by selective deposition.

In embodiments, the semiconductor substrate can be doped at least partly starting from the at least two recesses.

In embodiments, the semiconductor substrate can be doped by means of coating with a dopant-containing layer by chemical vapor deposition or by means of doping from the gas phase.

In embodiments, the at least two electrodes and diode layer stack can be provided on the semiconductor substrate by layer-by-layer growth [e.g. epitaxy] of the at least two electrodes and layer-by-layer growth [e.g. epitaxy] and local doping of the diode layer stack.

In embodiments, the diode layer stack can be doped by ion implantation in connection with photolithography.

In embodiments, the diode layer stack can comprise the following layers:
a $p^+$-doped layer,
an intrinsic or a $p^-$ doped layer,
a p-doped layer and an n$^+$-doped layer.

In embodiments, the diode layer stack can comprise the following layers:

an n$^+$-doped layer, an intrinsic or an n$^-$ doped layer, an n-doped layer and a p$^+$-doped layer.

In embodiments, the diode layer stack can alternatively also comprise the following layers:

an n$^+$-doped layer, an intrinsic layer, a p-doped layer, an intrinsic layer, a p$^+$-doped layer.

In embodiments, the diode layer stack can alternatively also comprise the following layers:

a p$^+$-doped layer, an intrinsic layer, an n-doped layer, an intrinsic layer, an n$^+$-doped layer.

In embodiments, the at least two electrodes can be formed by providing and structuring a metallization layer and/or heavily doped layer.

In embodiments, the method can further comprise a step of forming at least one guard structure [e.g. immediately] below at least one of the at least two electrodes [e.g. to concentrate the electric field in the area of the absorption volume [e.g. and to reduce the same in edge areas or to suppress current paths/leaking currents]].

In embodiments, the photodiode can be an avalanche photodiode or a photoelectron multiplier.

Further embodiments provide an orthogonal arrangement for avalanche photodiodes (APD) and silicon photomultipliers (SiPM) with high red sensitivity.

BRIEF DESCRIPTION OF THE DRAWINGS

Embodiments of the present invention will be discussed below in more detail with reference to the accompanying drawings, in which:

FIG. 1b shows, in diagrams, courses of dopant, absorption, electric field and conductor band plotted on the vertical section through the active region in the center of the avalanche photodiode (APD) shown in FIG. 1a;

DETAILED DESCRIPTION OF THE INVENTION

In the subsequent description of the embodiments of the present invention, the same or equal elements are provided with the same reference numbers in the figures such that their description is inter-exchangeable.

Figure 1A:
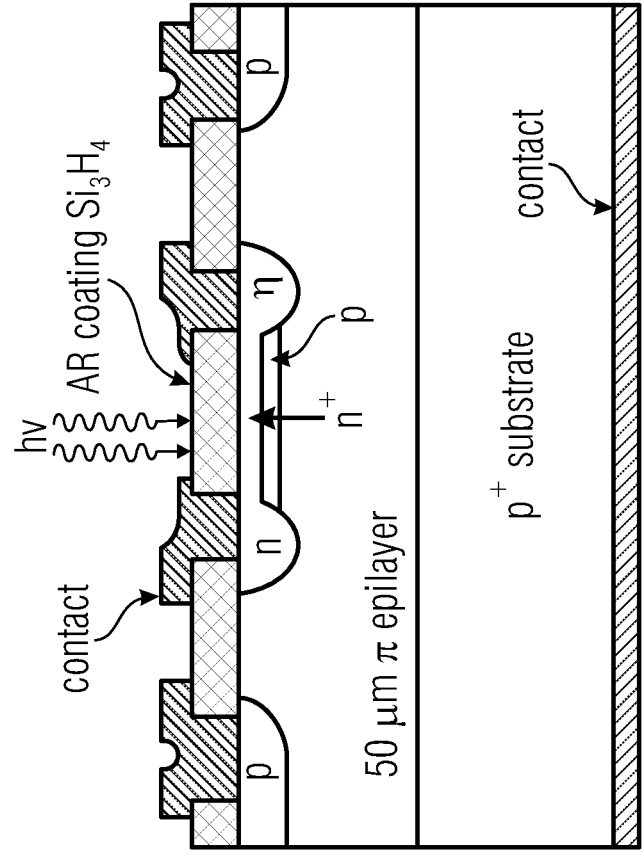
FIG. 1a is a schematic view of a basic structure of an avalanche photodiode in cross-section, here with a vertical dopant profile course n$^+$–p–i–p$^+$ [1]
Figure 1B:
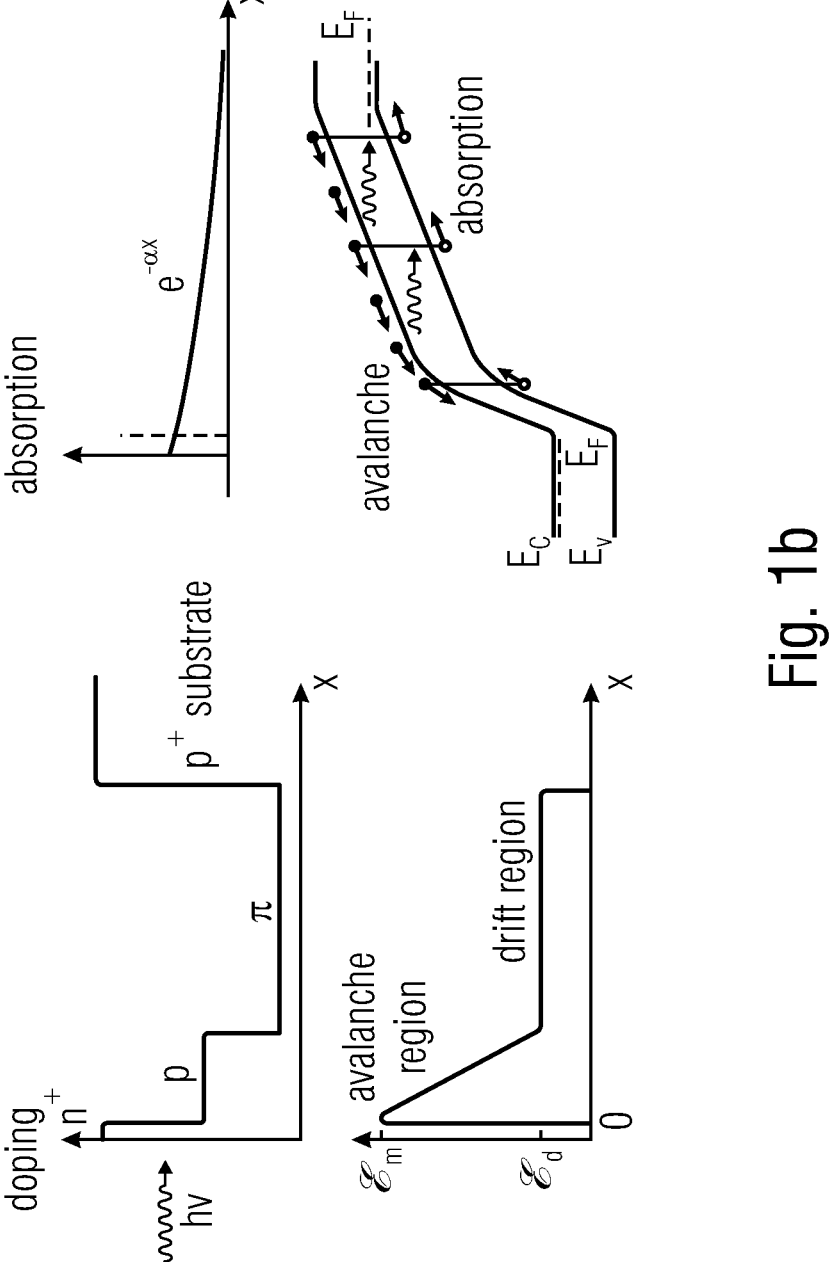
Figure 2A:
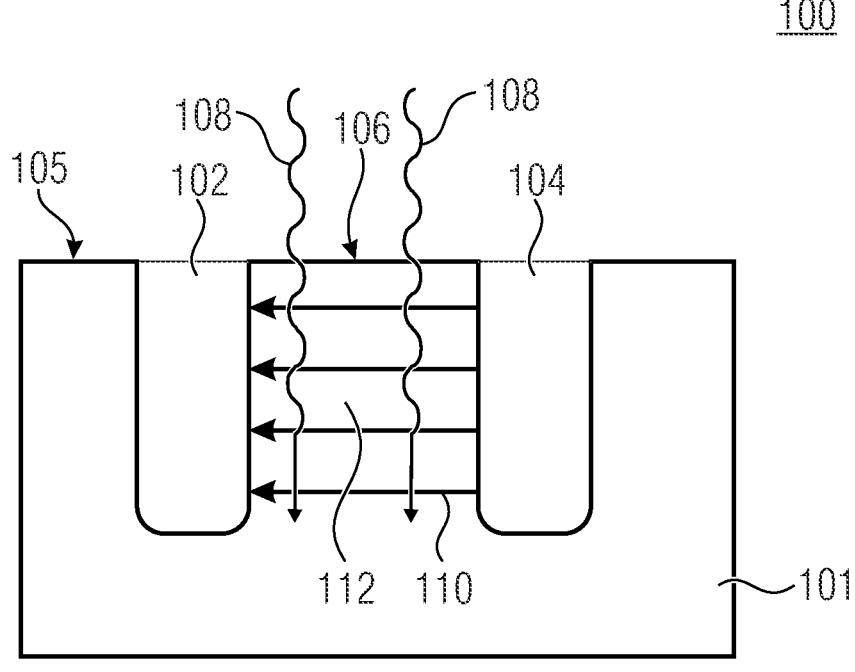
FIG. 2a is a schematic cross-sectional view of a photodiode according to an embodiment of the present invention.

FIG. 2a shows a schematic cross-sectional view of a photodiode 100 according to an embodiment of the present invention. The photodiode includes a semiconductor substrate 101, two electrodes 102 and 104 (e.g. an anode and a cathode) formed in the semiconductor substrate 101 and, between the electrodes 102 and 104, an absorption volume 112 for absorbing photons 108, wherein the absorption volume 112 comprises a photon entry area 106 on a surface 105 of the semiconductor substrate 101 or parallel to the surface 105. The electrodes 102 and 104 are configured to generate an electric field 110 in an active region (e.g. in the absorption volume 112) between the electrodes 102 and 104 when a reverse voltage is applied, wherein the electric field 110 runs parallel to the photon entry area 106 or the surface 105 of the photodiode 100.

As can be seen in FIG. 2a, the electrodes 102 and 104 are arranged essentially orthogonally (e.g. at an angle of 90° or at angle of 70° to 110°) to the photon entry area 106 or surface 105 of the photodiode 100. Thus, starting from the surface 105 of the semiconductor substrate 101 of the photodiode 100, the electrodes 102 and 104 essentially extend orthogonally to the surface 105 in depth direction of the semiconductor substrate 101.

Figure 2B:
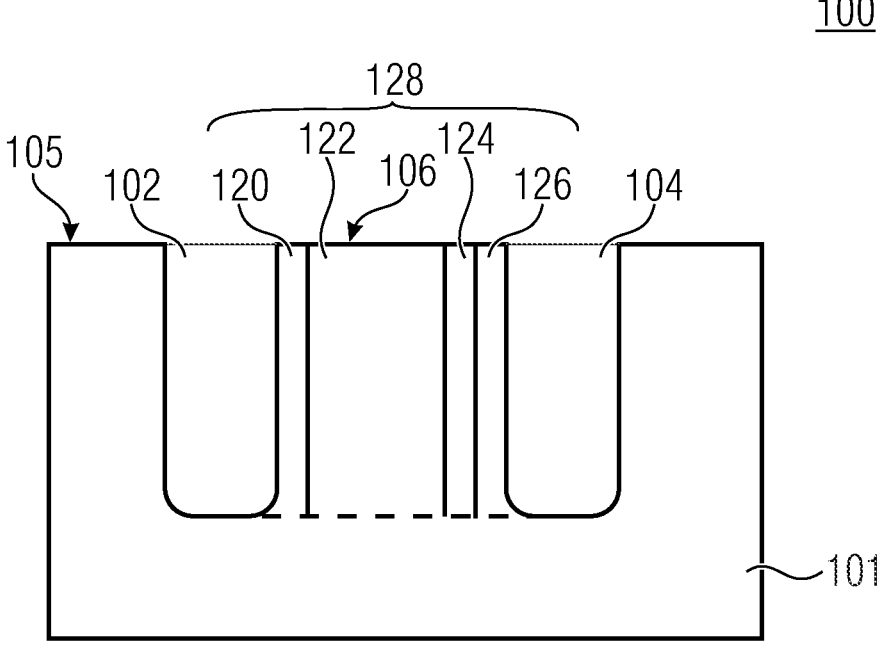
FIG. 2b is a schematic cross-sectional view of a photodiode according to an embodiment of the present invention.

FIG. 2b shows a schematic cross-sectional view of a photodiode 100 according to an embodiment of the present invention. Compared to FIG. 2a, FIG. 2b further shows an exemplary diode layer structure 128 of the photodiode 100. As can be seen in FIG. 2b, the layers 120, 122, 124, 126 of the diode layer structure 128 can essentially be arranged orthogonally to the photon entry area 106 or surface 105 of the photodiode 100.

In embodiments, the diode layer structure 128 of the photodiode 100 can comprise the following layers:
a $p^+$-doped layer 120,
an intrinsic or a $p^-$-doped layer 122,
a p-doped layer 124 and
an $n^-$ doped layer 126.

In embodiments, the diode layer structure 128 of the photodiode 100 can comprise the following layers:
an $n^+$-doped layer,
an intrinsic or an $n^-$-doped layer,
an n-doped layer and
a $p^+$-doped layer.

In embodiments, the diode layer structure 128 of the photodiode 100 can comprise the following layers:
an $n^+$-doped layer,
an intrinsic layer,
a p-doped layer,
an intrinsic layer,
a $p^+$-doped layer.

In embodiments, the diode layer structure 128 of the photodiode 100 can comprise the following layers:
a $p^+$-doped layer,
an intrinsic layer,
an n-doped layer,
an intrinsic layer,
an $n^+$-doped layer.

In embodiments, the photodiode can be an avalanche photodiode or a photoelectron multiplier.

In the following, detailed embodiments of the photodiode 100 will be described in more detail.

FIG. 3 shows a comparison between a conventional vertical avalanche photodiode 10 and an orthogonal avalanche photodiode 100 (avalanche photodiode with orthogonal structure) according to an embodiment of the present invention.

Figures 3A, 3B:
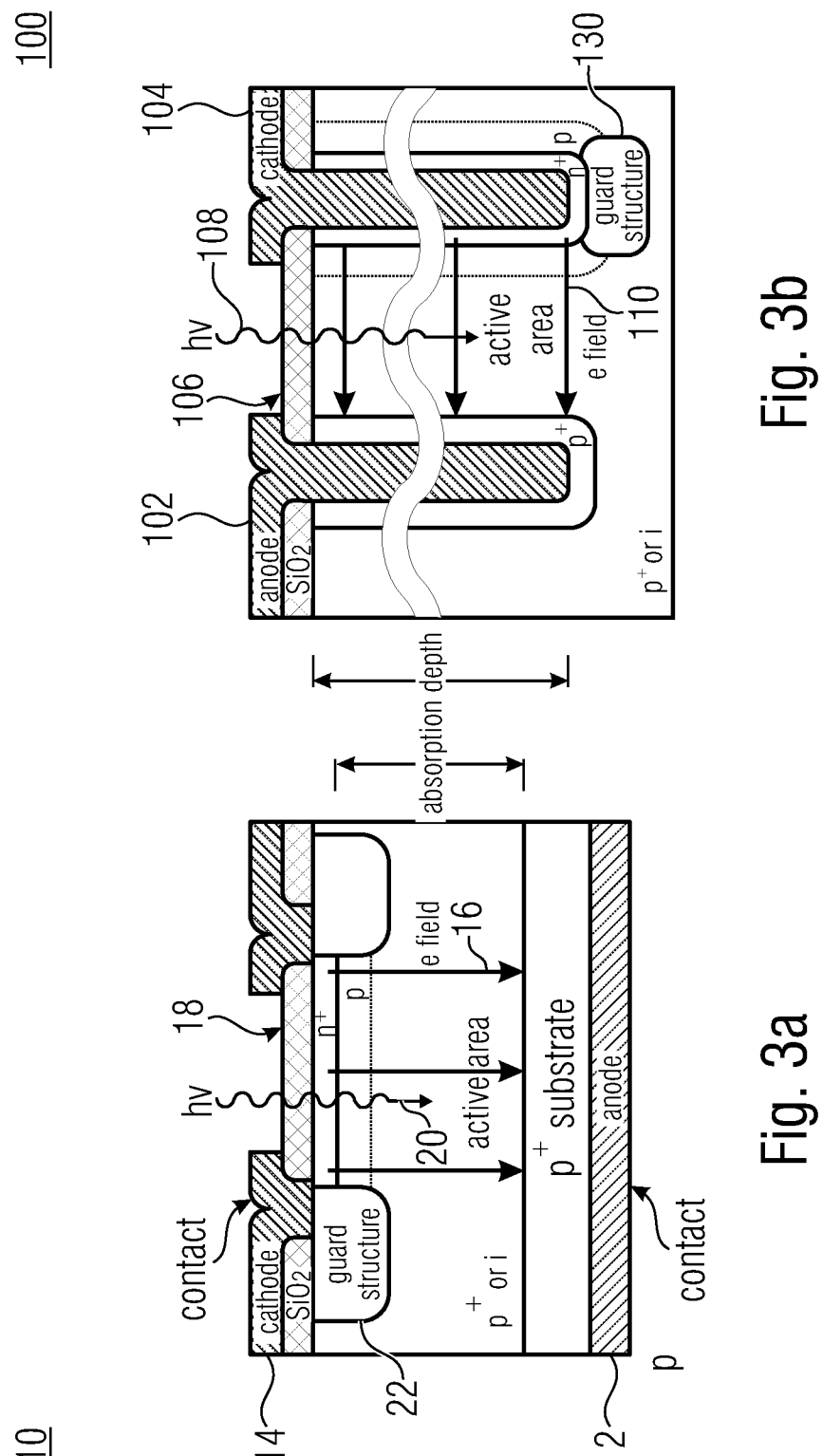
FIG. 3a is a schematic cross-sectional view of a conventional avalanche photodiode.
FIG. 3b is a schematic cross-sectional view of an avalanche photodiode according to an embodiment of the present invention.

In detail, FIG. 3a shows a schematic cross-sectional view of a conventional avalanche photodiode 100. As can be seen in FIG. 3a, this is a planar avalanche diode having a vertical structure where the anode 12 and cathode 14 are arranged vertically, such that, when a reverse voltage is applied, an electric field 16 is generated between the anode 12 and the cathode 14, which runs orthogonally to a photon entry area 18 of the photodiode 10 or parallel to the absorption direction of the photons 20. Accordingly, the layers ($p^+$, $p^-$ or i, p, $n^+$) of the diode layer structure of the conventional photodiode 10 also run parallel to the photon entry area 18 of the photodiode.

FIG. 3b, on the other hand, shows a schematic cross-sectional view of an avalanche photodiode 100 according to an embodiment of the present invention. In other words, FIG. 3b shows a concept of a three-dimensional orthogonal avalanche photodiode. Starting from the recesses in the substrate, by means of dopants, the deep-reaching active region can be generated. As can be seen in FIG. 3b, the photodiode 100 has an orthogonal structure, wherein the anode 110 and the cathode 104 are arranged orthogonally, such that when applying a reverse voltage, an electric field 110 is generated between the anode 100 and the cathode 104, which runs parallel to a photon entry area 106 of the photodiode 100 or orthogonally to the absorption direction of the photons 108. Accordingly, the layers (p+, p− or i, p, n+) of the diode layer structure of the photodiode also run orthogonally to the photon entry area 406.

Embodiments of the present invention allow preventing the dependency between absorption capacity and high operating voltage, since electric field and light incidence (optical absorption) run orthogonally to each other.

The electric field or the operating voltage of the photodiode is specified by the distance of cathode and anode. The absorption through the depth of the active field in silicon. By the orthogonal arrangement, operating voltage and absorption depth can be decoupled. The operating voltage can be adapted by the lateral dimensions.

Vertical photodiodes (c.f. FIG. 3a) as well as orthogonal photodiodes (c.f. FIG. 3b) need so-called guard structures 22 or 130, so that the avalanche multiplication or the breakdown in the Geiger mode only takes place in the intended areas. With an orthogonal photodiode 100, these guard structures 130 can be kept small in relation to the photon entry area.

Preventing breakdowns at undesired locations by local reduction of the electric field strength can be obtained by the following measures (guard structures):
By lateral geometric measures, such as closed cell structures (rotation-symmetric structure).
By increasing radii to prevent field peaks.
By reducing the local dopant concentration and hence increase of the space-charge zone.
By suppressing current paths with isolator layers.

Embodiments have the advantage that theoretically an absorption volume of any depth can be generated with the orthogonal structure, independent of the configuration of the electric operating voltage.

Embodiments have the advantage that in orthogonal photodiodes, (in contrary to vertical photodiodes), the guard structures can be structured such that the same do not reduce the photon entry area, by attaching, for example, the guard structures to the bottom end of the electrodes.

Embodiments of the present invention are used in cost-effective components having higher absorption and higher area efficiency for improving systems using avalanche photodiodes or silicon photomultipliers, such as:
LIDAR technology.
Highly sensitive photon spectroscopy.

Figure 4:
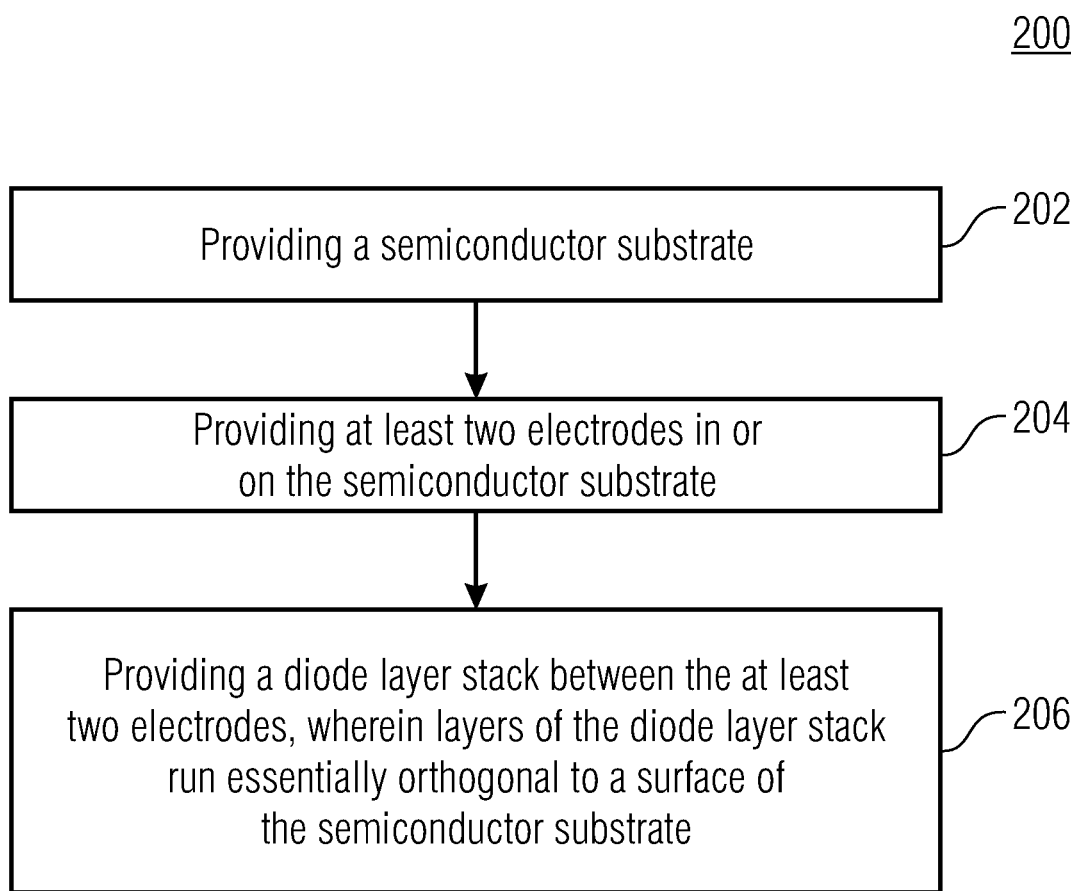
FIG. 4 is a flow diagram of a method for producing a photodiode according to an embodiment of the present invention.

FIG. 4 shows a flow diagram of a method 200 for producing a photodiode. The method 200 includes a step of providing 202 a semiconductor substrate. Further, the method includes a step 204 of providing at least two electrodes in or on the semiconductor substrate. Further, the method 200 includes a step 206 of providing a diode layer stack between the at least two electrodes, wherein layers of the diode layer stack essentially run orthogonally to a surface of the semiconductor substrate.

Two embodiments of the method 200 shown in FIG. 4 for producing the photodiode will be discussed in more detail below with reference to FIGS. 5 and 6 that show schematic cross-sectional views of the photodiode after different steps of the method for producing the same.

Figure 5A:
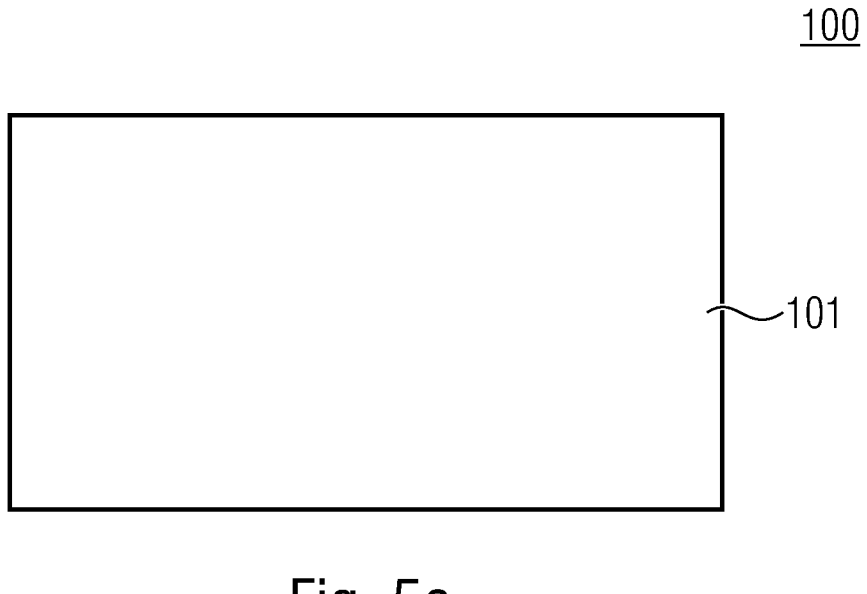
FIG. 5a is a schematic cross-sectional view of the photodiode during the production of the same after the step of providing the semiconductor substrate.

FIG. 5a shows a schematic cross-sectional view of the photodiode 100 during the production of the same after the step of providing the semiconductor substrate 101. The semiconductor substrate 101, for example, can be a silicon semiconductor substrate.

Figure 5B:
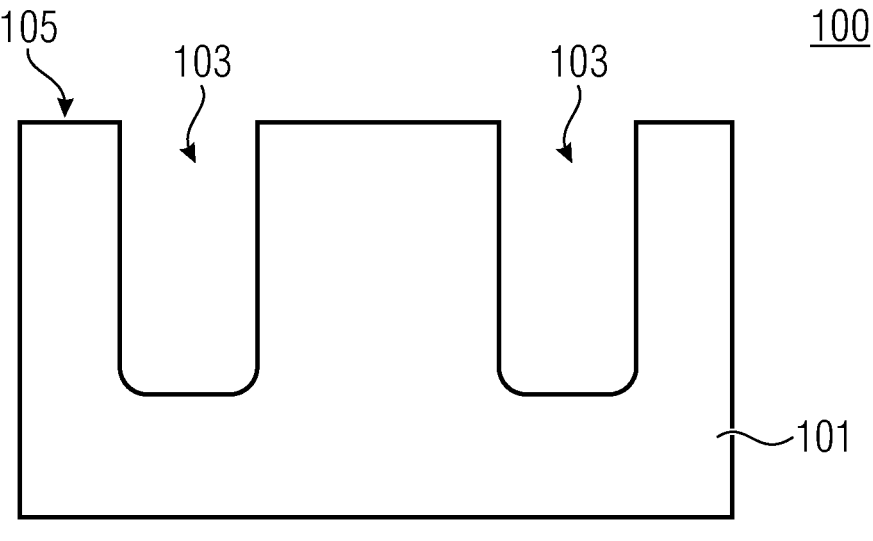
FIG. 5b is a schematic view of the photodiode during the production of the same after a step of forming at least two spaced-apart recesses in the semiconductor substrate.

FIG. 5b shows a schematic view of the photodiode 100 during the production of the same after a step of forming at least two spaced apart recesses 103 (e.g. trenches) in the semiconductor substrate 101, starting from a surface 105 of the semiconductor substrate 105.

As can be seen in FIG. 5b, the recesses 103 in the semiconductor substrate 101 can extend in depth direction of the semiconductor substrate 101, i.e. orthogonally to the surface 105 of the semiconductor substrate 101.

In embodiments, the at least two recesses 103 can be formed by etching.

Alternatively, the at least two recesses 103 can be formed by local oxidation of the semiconductor substrate and subsequent removal of the oxide or by growth by selective deposition.

Figure 5C:
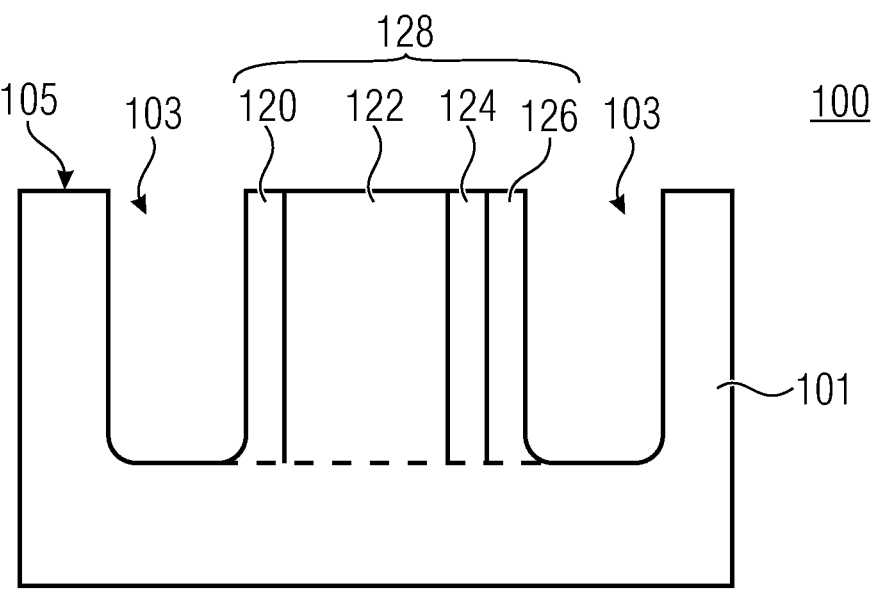
FIG. 5c is a schematic cross-sectional view of the photodiode during the production of the same after a step of doping the semiconductor substrate between the at least two recesses.

FIG. 5c shows a schematic cross-sectional view of the photodiode 100 during the production of the same after a step of doping the semiconductor substrate 101 between the at least two recesses 103 to obtain a diode layer stack 128 between the at least two recesses 103.

As can be seen in FIG. 5c, layers 120, 122, 124, 126 of the diode layer stack 128 can essentially run orthogonally to the surface 105 of the semiconductor substrate 101.

Here, it should be noted that the layers 120, 122, 124, 126 in FIG. 5c are only shown exemplarily and that the diode layer stack 128 can also be realized with a different number of layers as well as with a different arrangement of the layers.

In embodiments, the semiconductor substrate 101 can be doped at least partly starting from the at least two recesses 103.

In embodiments, the semiconductor substrate 101 can be doped by means of coating with a dopant-containing layer by chemical vapor deposition or by means of doping from the gas phase.

In embodiments, the diode layer structure 128 of the photodiode 100 can comprise the following layers:
  a $p^+$-doped layer,
  an intrinsic or a $p^-$-doped layer,
  a p-doped layer and
  an $n^+$-doped layer.

In embodiments, the diode layer structure 128 of the photodiode 100 can comprise the following layers:
  an $n^+$-doped layer,
  an intrinsic or an $n^-$-doped layer,
  an n-doped layer and
  a $p^+$-doped layer.

In embodiments, the diode layer structure 128 of the photodiode 100 can comprise the following layers:
  an $n^+$-doped layer,
  an intrinsic layer,
  a p-doped layer,
  an intrinsic layer,
  a $p^+$-doped layer.

In embodiments, the diode layer structure 128 of the photodiode 100 can comprise the following layers:
  a $p^+$-doped layer,
  an intrinsic layer,
  an n-doped layer,
  an intrinsic layer,
  an $n^+$-doped layer.

Figure 5D:
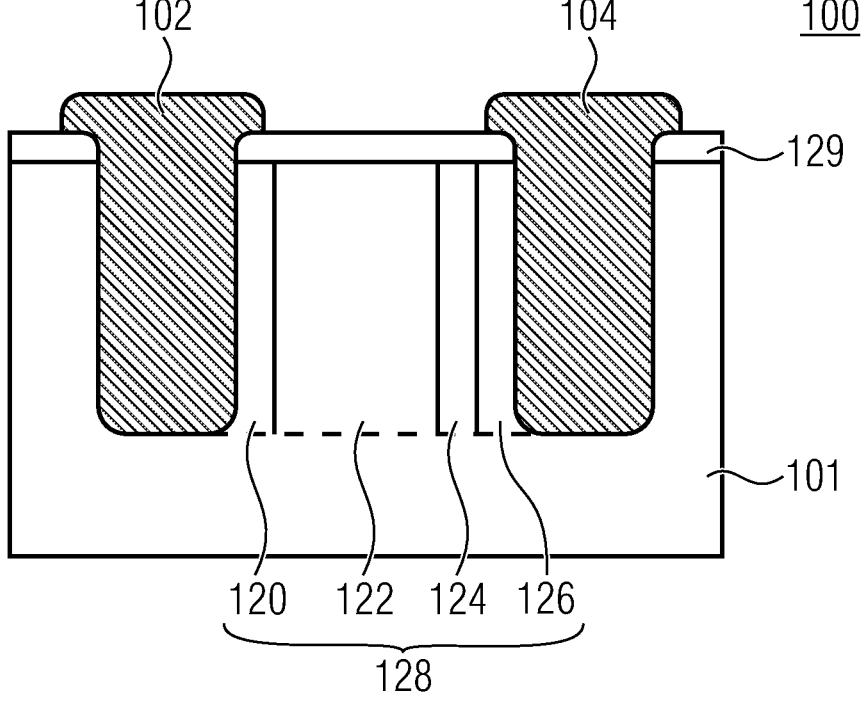
FIG. 5d is a schematic cross-sectional view of the photodiode during the production of the same after a step of providing a least two electrodes in the at least two recesses.

FIG. 5d shows a schematic cross-sectional view of the photodiode 100 during the production of the same after a step of providing at least two electrodes 102 and 104 in the at least two recesses.

In embodiments, the at least two electrodes can be formed by providing and structuring a metallization layer and/or heavily doped layer.

Figures 6A, 6B, 6C:
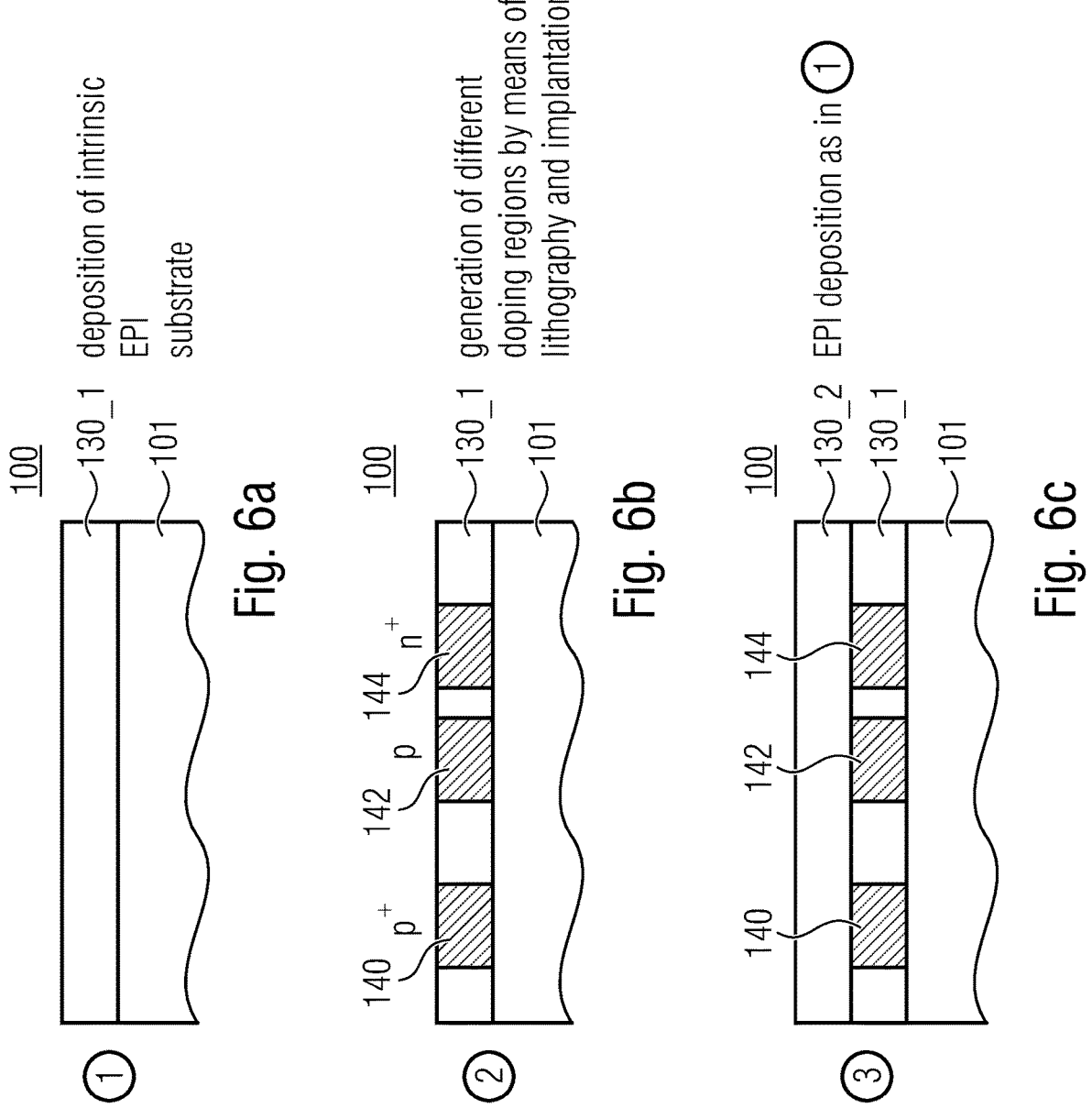
FIG. 6a is a schematic cross-sectional view of a photodiode during the production of the same after the step of providing the semiconductor substrate and growing a first layer on a surface of the semiconductor substrate.
FIG. 6b is a schematic cross-sectional view of the photodiode during the production of the same after a step of local doping of the first layer.
FIG. 6c is a schematic cross-sectional view of the photodiode during the production of the same after the step of growing a second layer on the first layer.

FIG. 6a shows a schematic cross-sectional view of the photodiode 100 during the production of the same after the step of providing the semiconductor substrate 101 and the growth of a first layer 130_1 on a surface of the semiconductor substrate 101.

In embodiments, the semiconductor substrate 101 can be a silicon semiconductor substrate.

In embodiments, the first layer 130_1 can be an intrinsic layer.

In embodiments, the first layer 130_1 can be grown by epitaxy such that the first layer 130_1 can be a first epitaxy layer.

FIG. 6b shows a schematic cross-sectional view of the photodiode 100 during the production of the same after a step of locally doping the first layer 130_1.

As can be seen in FIG. 6b, by doping locally, doped regions 140, 142 and 144 can be obtained in the first layer 130_1, such as a $p^+$-doped region 140, a p-doped region 142 and an $n^+$-doped region 144.

In embodiments, doping can be performed, for example by ion implantation in connection with photolithography.

FIG. 6c shows a schematic cross-sectional view of the photodiode 100 during the production of the same after the step of growing a second layer 130_2 on the first layer 130_1.

In embodiments, the second layer 130_2 can be an intrinsic layer.

In embodiments, the second layer 130_2 can be grown by epitaxy, such that the second layer 130_2 can be a second epitaxy layer.

Figures 6D, 6E:
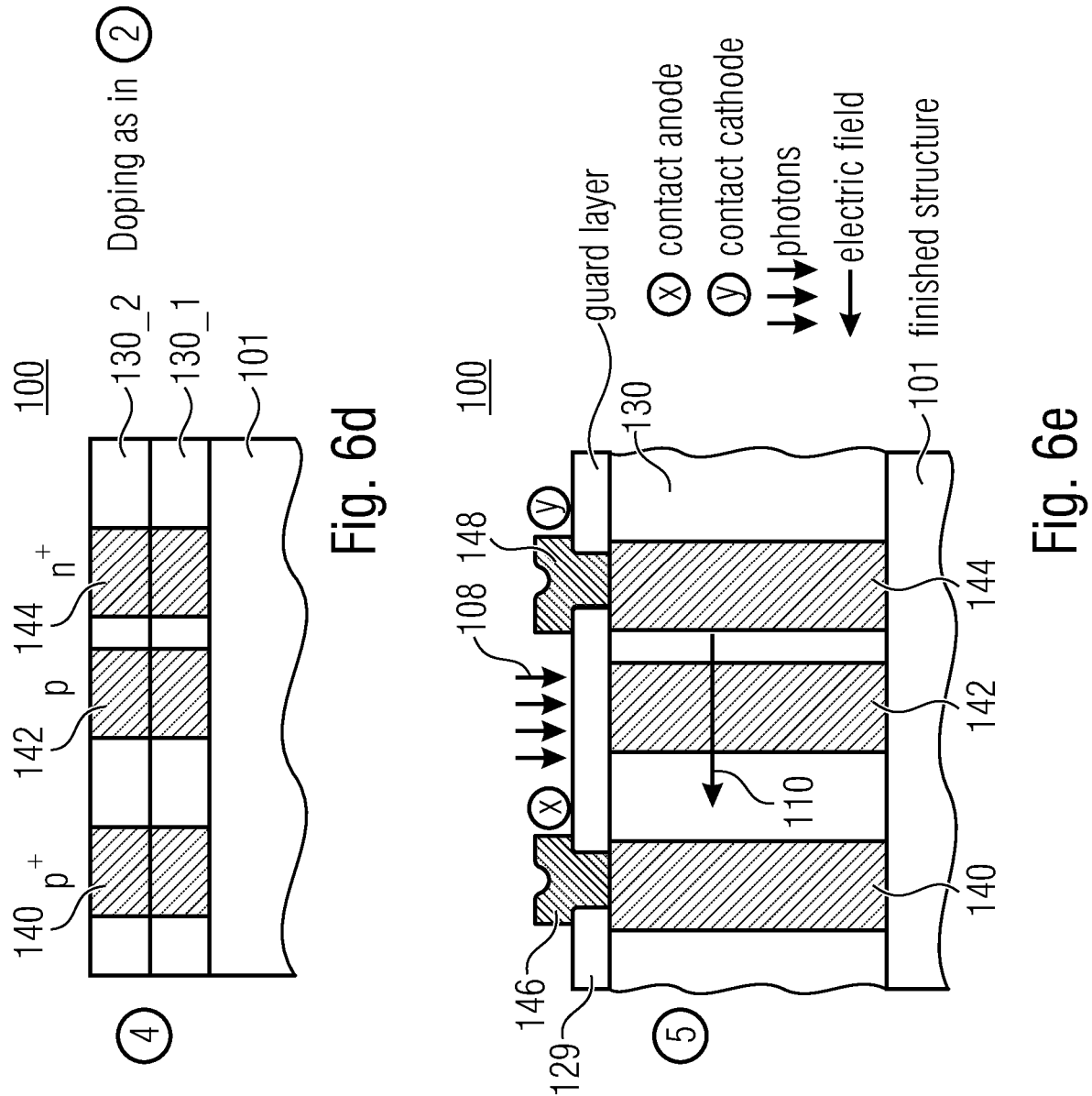
FIG. 6d is a schematic cross-sectional view of the photodiode during the production of the same after a step of local doping of the second layer.
FIG. 6e is a schematic cross-sectional view of the photodiode during the production of the same after several layers have been grown on the semiconductor substrate and contacts have been provided on the doped areas.

FIG. 6d shows a schematic cross-sectional view of the photodiode 100 during the production of the same after a step of locally doping the second layer 130_2.

As can be seen in FIG. 6d, by doping locally, doped regions 140, 142 and 144 can also be obtained in the second layer 130_2, such as a $p^+$-doped region 140, a p-doped region 142 and an $n^+$-doped region 144.

In embodiments, doping can take place, for example by ion implementation in connection with photolithography.

FIG. 6e shows a schematic cross-sectional view of the photodiode 100 during the production of the same after several layers 130 have been grown on the semiconductor substrate 101 and contacts 146 and 148 have been provided on the doped regions 140 and 144, such as a contact 146 for an anode and a contact 148 for a cathode.

Optionally, a guard layer 129, such as an oxide layer (e.g. SiO2) can be provided on the grown layers.

In embodiments, the photodiode can be an avalanche photodiode or a photoelectron multiplier.

In embodiments, as mentioned above (cf. e.g. FIG. 3b), the photodiode 100 can comprise at least one guard structure 130 arranged in the depth direction of the semiconductor substrate of the photodiode 100 below at least one of the at least two electrodes, e.g. to concentrate the electric field in the region of the absorption volume or to reduce the same in edge regions. Detailed embodiments of a photodiode 100 having such a guard structure 130 will be described in more detail below. The following description of the photodiode 100 or the guard structure 130 is here of course equally applicable to the embodiments of the photodiode 100 described above.

Figure 7:
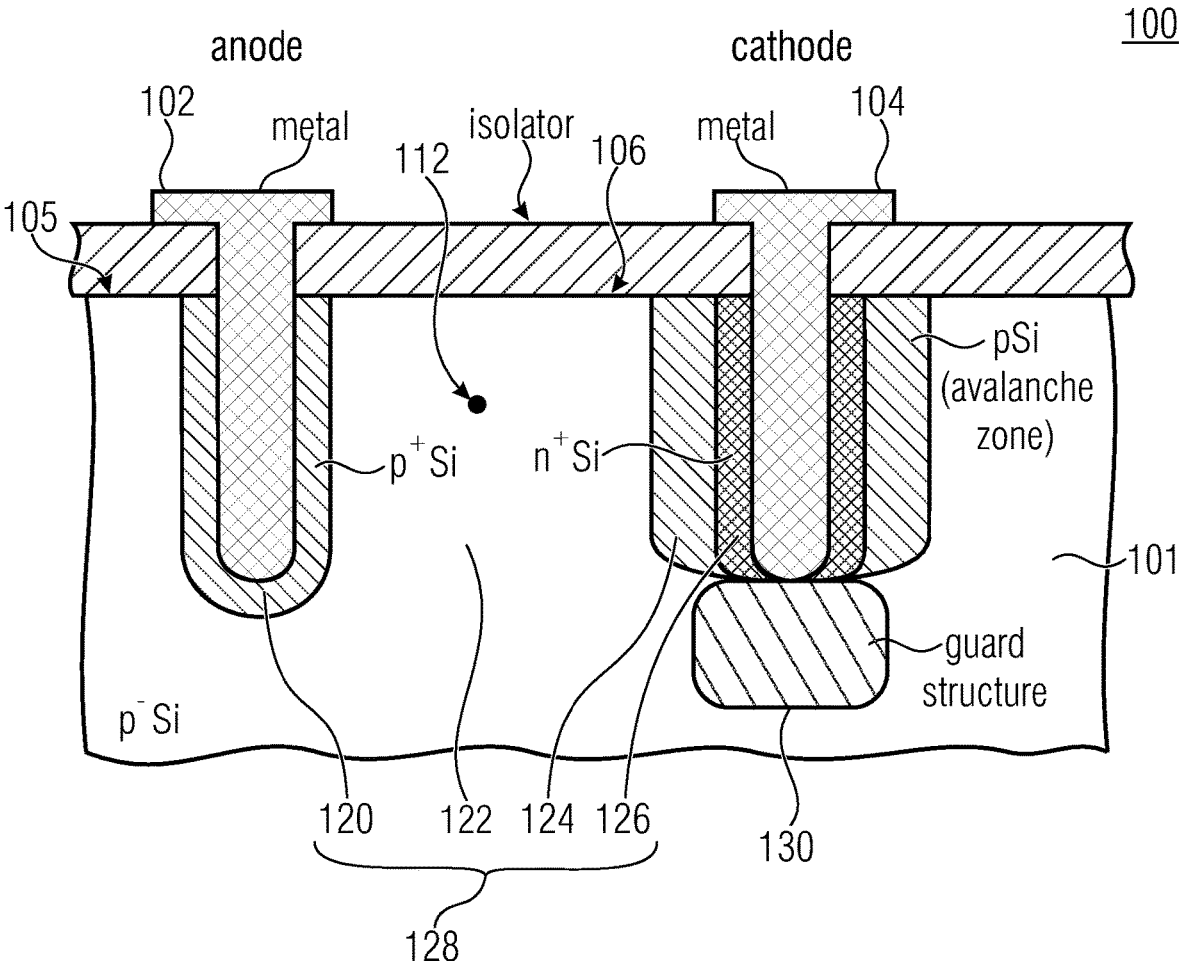
FIG. 7 is a schematic cross-sectional view of a photodiode according to another embodiment of the present invention.

FIG. 7 shows a schematic cross-sectional view of a photodiode 100 according to an embodiment of the present invention. The photodiode 100 includes a semiconductor substrate 101, two electrodes 102 and 104 formed in the semiconductor substrate 101 (e.g. anode 102 and cathode 104), an absorption volume 112 for absorbing photons between the two electrodes 102 and 104, and a diode layer stack 128 between the two electrodes 102 and 104, wherein layers 120, 122, 124 and 126 of the diode layer stack 128 in the region of the absorption volume 112 essentially run orthogonally to a surface 105 of the semiconductor substrate 101 or a photon entry area 106 of the photodiode 100 (lateral avalanche photodiode).

Through this, as this has been explained in detail above, when a reverse voltage is applied between the two electrodes 102 and 104, an electric field is generated between the two electrodes 102 and 104 that runs parallel to the photon entry area 106 of the photodiode 100 or the surface 105 of the semiconductor substrate 101.

The diode layer stack 128 can include a p$^+$-doped layer 120, an intrinsic or p$^-$-doped layer 122, a p-doped layer 124, and an n$^+$-doped layer 126, as exemplified in FIG. 7. Alternatively, of course, the diode layer stack 128 can comprise an n$^+$-doped layer 120, an intrinsic or n$^-$-doped layer 122, an n-doped layer 124, and a p$^+$-doped layer.

In embodiments, the semiconductor substrate 101 can be a continuous semiconductor substrate, such as a continuous silicon semiconductor substrate. Here, the photodiode 100 can be formed in this continuous semiconductor substrate 101. In embodiments, therefore, no silicon on insulator (SOI) substrate is needed, as is the case, for example, in [3].

In embodiments, starting from the surface 105 of the semiconductor substrate 101, the two electrodes 102 and 104 can extend at least to a depth of 5 μm (e.g., 10 μm to 20 μm, or 10 μm to 30 μm) into the semiconductor substrate 101.

Here, the two electrodes 102 and 104 can be formed in the semiconductor substrate 101 in two spaced-apart trenches. Prior to filling the two trenches with electrode material (e.g. a metallization layer or a heavily doped layer), the layers 120, 124 and 126 of the diode layer stack 128 can be generated by coating the walls of the two trenches with respective dopants and diffusing them, resulting in the shapes of the layers 120, 124 and 126 around the respective trenches or electrodes 102 and 104 shown in FIG. 7.

For geometric reasons, a field enhancement occurs at the lower end of one of the trenches filled with conductive material, such as the trench forming electrode 104 in FIG. 7 (cathode), which lowers the breakdown voltage there. The breakdown voltage can be significantly increased by the guard structure 130 (e.g., guard structure) so that the same is above the desired or required lateral breakdown voltage.

Therefore, in embodiments, a guard structure 130 is formed below at least one of the two electrodes 102 and 104, such as below the electrode 104 in FIG. 7 (cathode).

In embodiments, this guard structure 130 can be generated by reducing the dopant concentration of avalanche zone 124 and cathode 104 at the bottom end of the trench.

Alternatively, in embodiments, this guard structure 130 can be generated by suitably increasing the electrode radius at the bottom end of the trench. This can be achieved, for example, by a spherical extension during trench etching. As a result, this breakdown voltage can be adjusted independently of the lateral breakdown voltage.

In embodiments, a lateral extension of the guard structure 130 (e.g., in the lateral direction of the semiconductor substrate or parallel to the surface 105 of the semiconductor substrate) can be two to five times a lateral extension (e.g., diameter) of the corresponding trench or electrode.

In embodiments, an extension of the guard structure 130 can be limited in the lateral direction and/or in the depth direction, for example, to two to five times a lateral extension (e.g., diameter) of the corresponding trench or electrode.

In embodiments, the guard structure 130 can be spherical, cube-shaped, or cuboid-shaped, each with strongly rounded corners.

If the corresponding electrode (e.g., cathode) is formed as a (essentially) circular rod or closed rotation-symmetric locus, lateral guard structures are unnecessary. For example, the corresponding electrode (e.g., cathode) can be located in the center of the cell or as a frame of the cell.

Figure 8A:
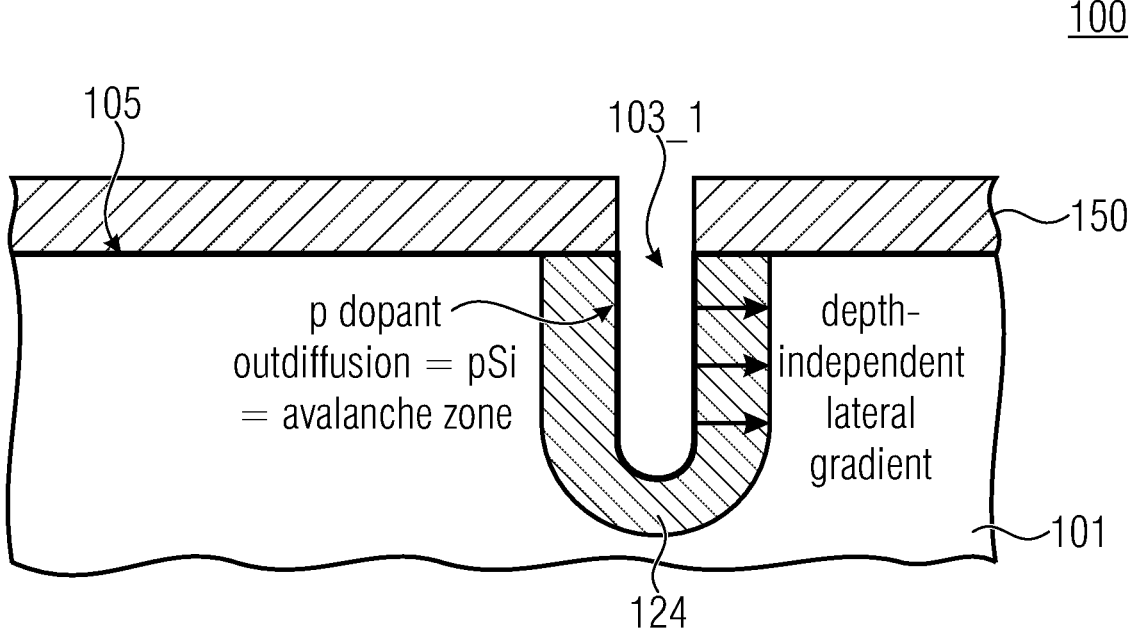
FIG. 8a is a schematic cross-sectional view of the photodiode during production of the same after a step of forming an avalanche layer of a diode layer stack of the photodiode.
Figure 8B:
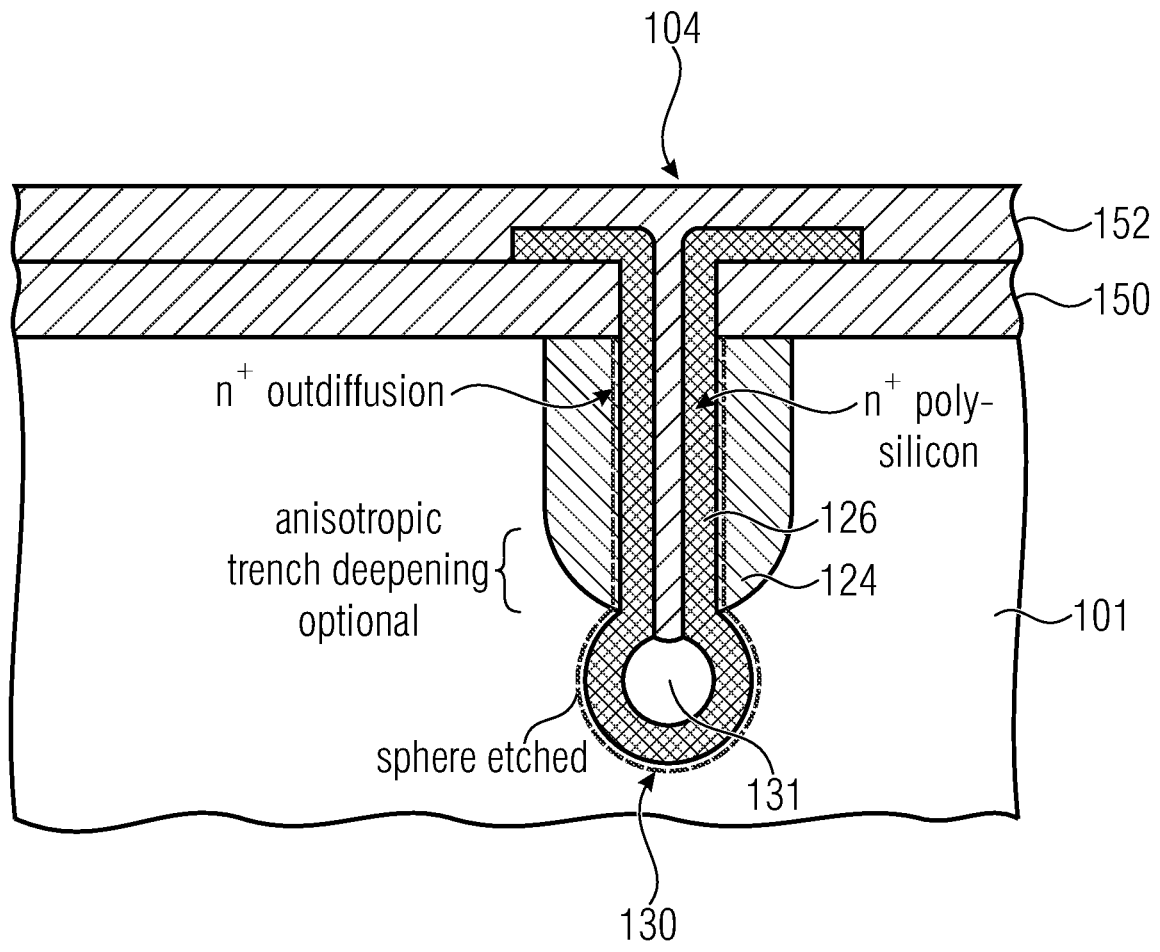
FIG. 8b is a schematic cross-sectional view of the photodiode during production of the same after a step of forming a first electrode (e.g., cathode) as well as a guard structure below the first electrode.
Figure 8C:
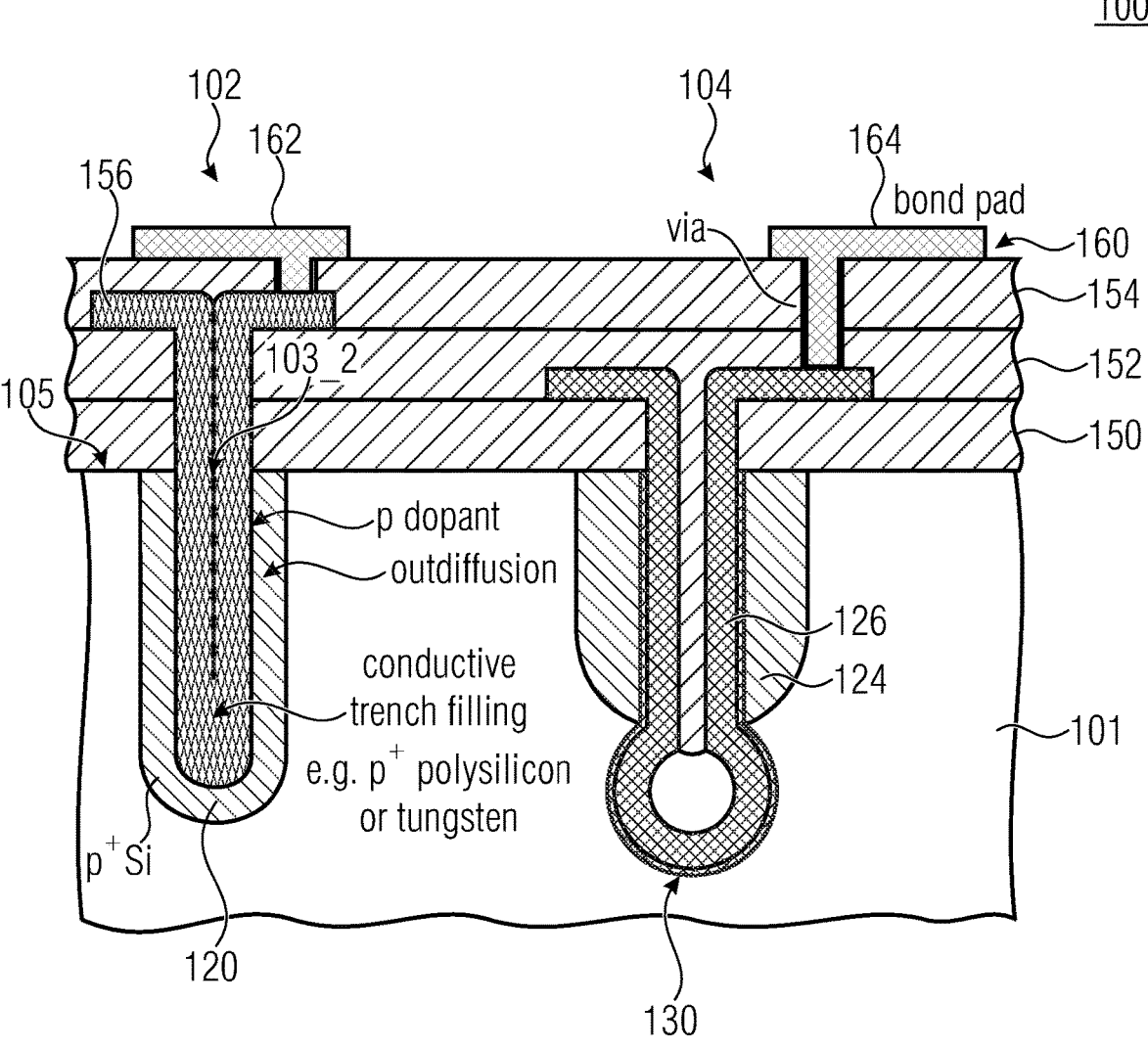
FIG. 8c is a schematic cross-sectional view of the photodiode during production of the same after producing another layer of the diode layer stack, a second electrode and a contacting of the first and second electrodes.

In the following, an embodiment of a method for producing a photodiode 101 with such a guard structure 130 below at least one of the two electrodes is described in more detail with reference to FIGS. 8a to 8c. Here, FIGS. 8a to 8c show different intermediate products of the photodiode 101 during the production of the same. Here, the production of a spherical guard structure 130 is shown as an example. However, the following description is also applicable in a corresponding manner to other guard structures.

FIG. 8a shows a schematic cross-sectional view of the photodiode 100 during the production of the same after a step of forming the layer 124 (avalanche layer/avalanche zone) of the diode layer stack. For this, first, a semiconductor substrate 101, such as a silicon semiconductor substrate, is provided. A first oxide layer 150 is deposited on a surface 105 of the semiconductor substrate 101 and a first trench 103_1 is formed in the semiconductor substrate 101, e.g. starting from the surface 105 of the semiconductor substrate 101 in the depth direction of the semiconductor substrate (e.g. perpendicular to the surface 105), for example up to a depth of at least 5 μm (e.g. 10 μm to 20 μm, or 10 μm to 30 μm). Here, the first trench 103_1 can have a lateral extension (e.g., diameter) of 0.5 μm to 2 μm, for example. Subsequently, the wall of the first trench 103_1 can be covered with a dopant, such as a p-dopant, and the layer 124 (avalanche layer/avalanche zone) can be formed by diffusing the dopant. Here, the lateral diffusion gradient is depth-independent.

FIG. 8b shows a schematic cross-sectional view of the photodiode 100 during the production of the same after a step of forming a first electrode 104 (e.g., cathode) as well as a guard structure 130 below the first electrode 104. For this, a spherical recess 131 is etched at a bottom end of the first trench 103_1, for example by isotropic etching (e.g., isotropic sphere etching). Optionally, the first trench 103_1 can be previously extended in the depth direction, for example by anisotropic etching (e.g., anisotropic trench deepening). Subsequently, a polysilicon layer 126, such as an n$^+$-polysilicon layer, can be deposited on the walls of the first trench 103_1 and the spherical recess 131, wherein ions (e.g., n+ ions) diffuse out of the polysilicon layer 126 into the layer 124 (avalanche layer/avalanche zone) and below the layer 124 into the semiconductor substrate 101. A portion of the polysilicon layer 126 deposited on the first oxide layer 150 can be structured, for example, to limit a lateral extension of the polysilicon layer 126 on the first oxide layer 150. The first trench 130_1 can be filled/closed by depositing a second oxide layer 152. Here, the polysilicon layer 124 can form the first electrode 104 (e.g., cathode) of the photodiode 100.

FIG. 8c shows a schematic cross-sectional view of the photodiode 100 during production of the same after the production of the layer 120 of the diode layer stack, a second electrode 102 as well as the contacting of the first and second electrodes 102 and 104. For this, first, a second trench 103_2 can be formed in the semiconductor substrate 101, e.g. starting from the surface 105 of the semiconductor substrate 101 in the depth direction of the semiconductor substrate (e.g. perpendicular to the surface 105), for example to a depth of at least 5 µm (e.g. 10 µm to 20 µm, or 10 µm to 30 µm). Here, the second trench 103_2 can have a lateral extension (e.g., diameter) of 0.5 µm to 2 µm, for example. Subsequently, the wall of the second trench 103_2 can be covered with a dopant, such as a p dopant, and the layer 120 of the diode layer stack can be formed by diffusing out the dopant, which can be, for example, a p⁺-doped layer. Here, the lateral diffusion gradient is depth-independent. The second trench 103_2 can subsequently be filled with an electrode layer 156, such as tungsten or p⁺-polysilicon. A part of the electrode layer 156 deposited on the second oxide layer 152 can be structured, for example, to limit a lateral extension of the electrode layer 156 on the second oxide layer 152. Subsequently, a third oxide layer 154 can be deposited to close the second trench 103_2. Vias for contacting the respective electrode layers 156 and 126 can be formed through the respective oxide layers 152, 154 and a metal layer 160 can be deposited to contact the respective electrode layers 156 and 126. The metal layer 160 can then be structured to provide contact terminals (e.g., bond terminals) 162 and 164.

Embodiments of the present invention allow the generation of an orthogonal avalanche photodiode (APD) with depths of 10 µm and significantly more. In embodiments, the breakdown voltage and thus the APD gain is depth-independent. This is achieved by the following measures. First, trench etching and then coating of the trench sidewall with dopants (e.g. coating from the gas phase: CVD, epitaxy, doped oxides, etc.). Then lateral diffusion of the dopants to generate the "avalanche layer" (marked by reference sign 124 in FIGS. 8a-8c).

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus. Some or all of the method steps can be performed by a hardware apparatus (or using a hardware apparatus), such as a microprocessor, a programmable computer or an electronic circuit. In some embodiments, some or several of the most important method steps can be performed by such an apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] S. M. Sze und M. K. Lee, Semiconductor Devices—Physics and Technology, 3. Edition Ed., John Wiley & Sons, 2012.
[2] S. M. Sze und Kwok K. Ng, Physics of Semiconductor Devices, John Wiley & Sons, 2007, pp. 102-114, 691.

[3] US 2014/0312449 A1

The invention claimed is:

1. A method for producing a photodiode, the method comprising:
   providing a semiconductor substrate,
   providing at least two electrodes in or on the semiconductor substrate, wherein, starting from a surface of the semiconductor substrate of the photodiode, the at least two electrodes essentially extend orthogonally to the surface in a depth direction of the semiconductor substrate,
   providing a diode layer stack between the at least two electrodes, wherein layers of the diode layer stack essentially run orthogonally to the surface of the semiconductor substrate,
   forming, in the semiconductor substrate, at least one guard structure below at least one of the at least two electrodes,
   wherein the at least two electrodes, the at least one guard structure and the diode layer stack are provided in the semiconductor substrate by
   forming, starting from the surface of the semiconductor substrate, at least two spaced-apart recesses in the semiconductor substrate,
   forming a guard structure recess below one of the at least two electrodes,
   doping the semiconductor substrate between the at least two spaced-apart recesses, starting from the at least two spaced-apart recesses and partially starting from the guard structure recess, to form the at least one guard structure and the diode layer stack between the at least two spaced-apart recesses, wherein the layers of the diode layer stack essentially run orthogonally to the surface of the semiconductor substrate,
   providing the at least two electrodes in the at least two spaced-apart recesses.

2. The method according to claim 1,
   wherein the at least two spaced-apart recesses are formed by etching or by local oxidation of the semiconductor substrate and subsequent removal of oxide or by growing by selective deposition.

3. The method according to claim 1,
   wherein the semiconductor substrate is doped by means of coating with a dopant-comprising layer by chemical vapor deposition or by means of doping from a gas phase.

4. The method according to claim 1,
   wherein the at least two electrodes are provided on the semiconductor substrate, and
   wherein the at least two electrodes and the diode layer stack are provided on the semiconductor substrate by layer-by-layer growth of the at least two electrodes and layer-by-layer growth and local doping of the diode layer stack.

5. The method according to claim 3,
   wherein the diode layer stack is doped by ion implantation using photolithography.

6. The method according to claim 1,
   wherein the diode layer stack comprises:
   a p⁺-doped layer,
   an intrinsic or a p-doped layer,
   a p-doped layer, and
   an n⁺-doped layer;

or wherein the diode layer stack comprises:

an $n^+$-doped layer, an intrinsic or an n-doped layer, an n-doped layer, and a $p^+$-doped layer.

7. The method according to claim 1, wherein the at least two electrodes are formed by providing and structuring a metallization layer and/or heavily doped layer.

8. The method according to claim 1, wherein the photodiode is an avalanche photodiode or a photoelectron multiplier.

\* \* \* \* \*